Figure 1:
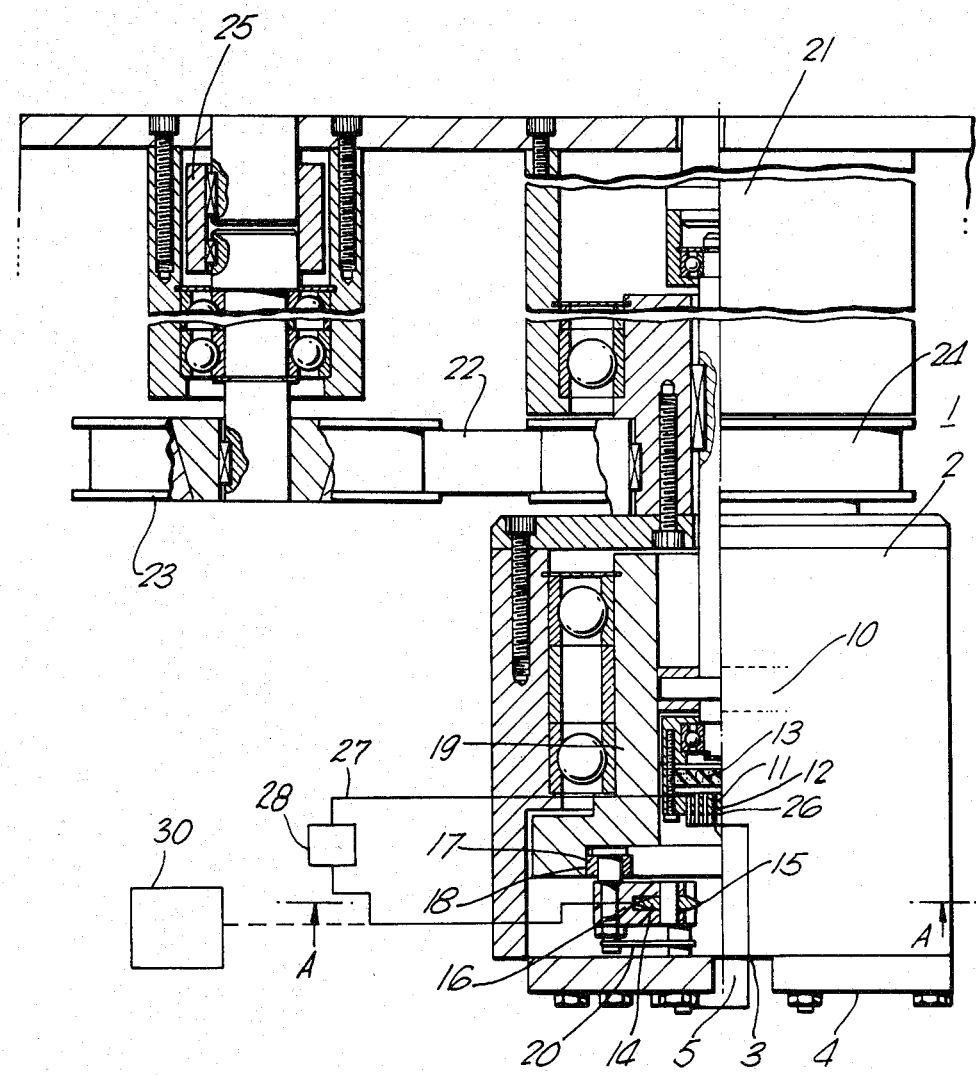

United States Patent [19]

Allard

[11] Patent Number: 4,670,707

[45] Date of Patent: Jun. 2, 1987

[54] METHOD AND APPARATUS FOR DETERMINING THE ELECTRICAL CONNECTION BETWEEN A PROBE AND CONDUCTOR UNDER TEST

[75] Inventor: Vincent L. Allard, Staines, England

[73] Assignee: BICC Public Limited Company, London, England

[21] Appl. No.: 745,900

[22] Filed: Jun. 18, 1985

[30] Foreign Application Priority Data

Jun. 20, 1984 [GB] United Kingdom ............. 8415733

[51] Int. Cl.$^4$ ........................................... G01R 31/02
[52] U.S. Cl. ................................... 324/51; 29/593
[58] Field of Search ............... 324/51, 52, 54, 158 F; 29/705, 593

[56] References Cited

U.S. PATENT DOCUMENTS 4,110,880 9/1978 Peppler et al. ............. 324/51 X
4,158,167 6/1979 Tanno et al. ............... 324/51

Primary Examiner—Reinhard J. Eisenzopf
Assistant Examiner—Jack B. Harvey
Attorney, Agent, or Firm—Anthony J. Casella; Gerald E. Hespos

[57] ABSTRACT

A station for testing one or more electric conductors (8) covered in insulating material (9) includes one or more contact probes (14) movable to pierce the insulation and contact the conductors (8). Additionally one or more contact pins (12), resiliently mounted in a mounting (11) are movable to engage and electrically connect with one free end of the exposed conductors (8). A voltage set up between the contact probes (14) and the one or more contact pins (12) provides an indication of whether the contact probes have made an electrical connection with their respective conductor. The probes (14) are circular with a circumferential cutting edge (15). They may conveniently be moved to pierce the insulating material (9) by rotation of their mounting (16) about the axis of the conductor under the action of a cam follower (17) on a cam profile (18).

14 Claims, 2 Drawing Figures

METHOD AND APPARATUS FOR DETERMINING THE ELECTRICAL CONNECTION BETWEEN A PROBE AND CONDUCTOR UNDER TEST

This invention relates to a station for testing an electric conductor covered in electrically insulating material, and/or electric cables incorporating such electric conductors. This invention has particular, though not exclusive, use for testing such an electric conductor or such an electric cable after it has been wound onto a spool, or into a coil.

One of the problems of testing an electric conductor or an electric cable on an automated or semi-automated basis is to ensure that an electrical connection has been made by a test probe to the conductor under test. It is an object of this invention to overcome this problem.

According to the present invention, a station for testing an electric conductor covered in electrically insulating material, and/or electric cables incorporating such electric conductors comprises a plurality of contact pins which are electrically connected to one another and which are mounted in pin mounting means, the pin mounting means being capable of movement in a direction along the longitudinal axis of one of the free ends of the conductor or conductors under test such that the pins can be moved to engage, and electrically connect with, the exposed conductor or all of the exposed conductors at said one free end; at least one contact probe for each conductor to be tested, the or each probe having insulating piercing means and being secured in probe mounting means, the or each probe mounting means being capable of movement along a plane at an angle to the longitudinal axis of said one free end such that the or each probe can be moved to pierce the insulating material covering its respective conductor and electrically connect with said conductor adjacent said one free end; and an electric circuit interconnecting the or each probe and the pins, the circuit having means for applying a voltage between the pins and the or each probe, and means for indicating that the or each probe has made an electrical connection with its respective conductor.

Once an electrical connection is made between the or each probe and its respective conductor, the pins are moved to disengage from the conductor or conductors under test, a second probe, or second set of probes, can be electrically connected to the other free end of the conductor or conductors, preferably in a similar manner, and testing of the or each conductor can be made. The types of tests which can be performed include conductor continuity; low and high voltage insulation breakdown; and conductor resistance.

The angle of the plane of movement of the probe mounting means to the longitudinal axis of said one free end is preferably substantially 90°.

The pin mounting means preferably comprises a plate having a plurality of apertures (one for each pin), one end of each pin projecting through the apertures for engaging the conductor or conductors, the other end of each pin engaging resilient means which allow each pin limited movement along its longtitudinal axis with respect to the plate. This arrangement substantially prevents the pins damaging the conductor or conductors when they engage. The resilient means preferably comprises a block of sponge rubber. The plate preferably includes a spike which projects away from the plate on the opposite side to the resilient means and in the same direction as the pins. This spike can be used when testing an electric cable comprising three or more conductors, to ensure the cable is centrally positioned with respect to the contact probes. Preferably the pin mounting means is moved by a pneumatically actuated arrangement.

The or each contact probe is preferably circular with the circumferential edge being shaped to pierce the conductor insulation. In this case, the or each probe is preferably mounted such that it can rotate about its centre.

The probe mounting means is preferably rotatable about the longitudinal axis of said one free end. In this case, the probe mounting means preferably comprises a cam profile, a cam follower for each probe, and spring loading means for each probe, the or each probe, cam follower and spring loading means being mounted to rotate about the longitudinal axis of said one free end relative to the cam profile. In this arrangement, when the cam profile is rotated relative to the other parts of the probe mounting means, the cam profile acts on the or each cam follower to move the or each probe against the action of the spring loading means to pierce the conductor insulation to make an electrical connection with the or each conductor. Further rotation allows the probe or probes to move away from the conductor or conductors under the action of the spring loading means. The spring loading means is preferably a torsion spring. The probe mounting means is preferably rotated by a belt and pulley arrangement which is preferably pneumatically actuated. Preferably a voltage is applied between the pins and the or each probe before the probe mounting means is rotated, and rotation is continued until an indication is given that the or each probe has made an electrical connection with its respective conductor.

Preferably, all movements of the pins and the or each probe, and their mounting means, and operation of the electric circuit is controlled by a programmable controller, preferably a microprocessor or microcomputer.

This invention has particular application when used with the winding apparatus described in our U.S. Pat. No. 8,415,732 filed the same day as this application. In this case, the said one free end of the conductor or conductors is preferably the end of the conductor or cable which has been bent to extend parallel to the longitudinal axis of the barrel of the spool.

This invention includes a method of testing an electric conductor covered in elelectrically insulating material, and/or electric cables incorporating such electric conductors using the station described herein.

In particular a method of testing an electrical conductor covered in electrically insulating material and/or electric cables incorporating such electric conductors comprises the steps of moving at least one probe along a plane at an angle to the longitudinal axis of one of the free ends of the conductor or conductors such that the probe pierces the insulating material covering its respective conductor or conductors to make an electrical connection therewith, the one or more contact pins being additionally moved in a direction along the longitudinal axis of the said one free end of the conductor or conductors under test, to engage and electrically contact with the exposed conductor or all of the exposed conductors at the said free end, and an electric circuit is made interconnecting the or each probe and the one or more pins, a voltage being applied between the one or more pins and the or each probe to give an indication of whether the or each probe has made an electrical connection with its respective conductor.

Figure 2:
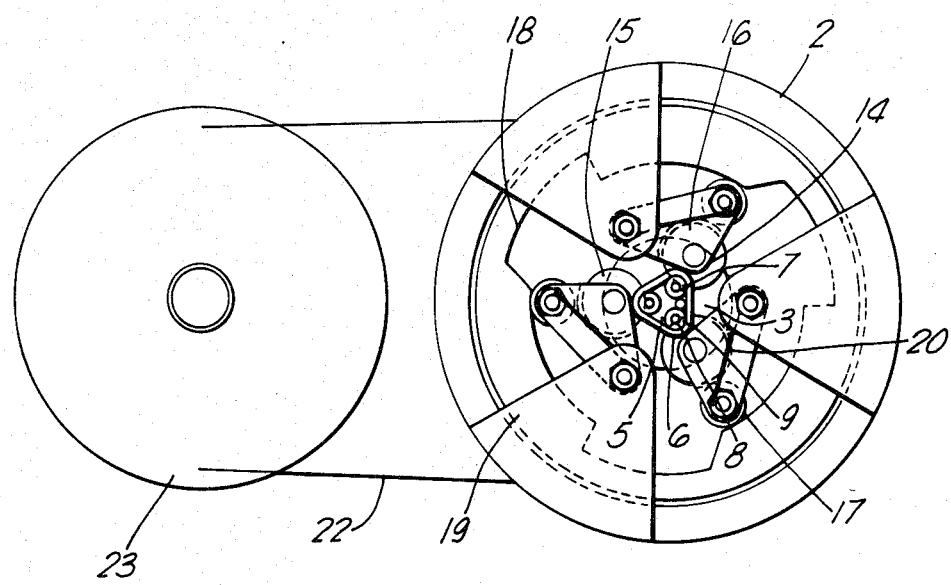

One embodiment of the invention will now be further described, by way of example only, with reference to the accompanying drawings in which:

FIG. 1 is a side view, partly in section, of a testing station in accordance with the invention; and FIG. 2 is a cross-sectional view through the line A—A of FIG. 1.

Referring to the drawings a probe mounting means shown generally at 1 comprises a cylindrical block 2 having a central bore 3 extending from one end face 4 thereof. The bore 3 can accommodate a portion of the cable 5 comprising an outer sheath 6 and three insulated conductors 7, each having a metallic core 8 covered with an insulating covering 9.

Coaxially slidable in the bore 3, under the influence of a hydraulic system shown generally at 10, is a pin mounting plate 11. The mounting plate 11 comprises a plurality of contact pins 12, mounted in coaxial alignment with the bore 3. The pins 12 are resiliently mounted in the plate 11 by means of a packing 13 of sponge rubber. A downardly extending spike 26 is provided at the centre of the mounting plate.

Mounted radially around the bore 3 are three contact probes 14. Each probe 14 is circular with a circumferential cutting edge 15. The probes are mounted on pivotable linkage members 16 having incorporated therein a cam follower 17, urged into contact with a cam profile surface 18 present on a sleeve 19 contained within the block 2. The cam follower is pressed against the surface 18 under the action of a torsion spring 20.

The whole of the block 2 is rotatably suspended from a support 21. The block may be rotated by a belt 22 and pulleys 23 and 24, pulley 23 being driven by a motor 25.

In use the end of a cable 5 is inserted in the bore 3 and the pin mounting plate 11 is moved by the hydraulic system 10 such that the pins 12 contact the exposed end of the cable. One or more of the pins 12 will make an electrical connection with the core 8 of each of the conductors 7, the spike 26 assisting in locating the mounting plate 11. The block 2 is rotated by the belt and pulley system urging the contact probes 14 inwardly under the action of the cam follower 17 and cam surface 18. The cutting edge 15 of the probes 14 cuts through the outer sheath 6 and insulating covering 9 to make an electrical connection with each core 8. A voltage is applied between the pins 12 and probe 14 through circuit 27 to test that an electrical connection between the probe and the core has been made. The circuit 27 includes means 28 for applying voltage between the contact pins 12 and the probe 14 and for determining the existence of an electrical connection therebetween. Additionally, the contact probe 14 can be electrically connected to a second contact probe means 30 which preferably operates similar to probe 14 to be placed in contact with the opposed end on the conductor, such that appropriate tests on the conductor can be performed.

If the indication is that the connection has been made, the pin mounting plate 11 is withdrawn and a second probe or probes (not shown) can be inserted in the cable 5 at a remote point in a similar manner. Testing of the conductors can now be performed.

What is claimed is:

1. A testing station for achieving and insuring electrical connection to at least one elongated electrical conductor covered in electrically insulating material, said connection being at a location substantially adjacent an end of said elongated electric conductor, said testing station comprising: receptacle means for receiving said end of said electrical conductor covered in electrically insulating material; at least one contact probe movably mounted adjacent said receptacle means and having insulation piercing means for piercing the insulation of said conductor; means for moving the contact probe along a plane disposed at an angle to the longitudinal axis of the electrical conductor adjacent the end thereof received in the receptacle means, the means for moving the contact probe being operative to move the contact probe into a position for piercing the insulating material and for making electrical connection to the electrical conductor; at least one contact pin movably mounted adjacent said receptacle means and disposed to be substantially aligned with the axis of said conductor; means for moving the contact pin generally along the longitudinal axis of said conductor and into electrical connection with the end of said conductor; and an electric circuit interconnecting the contact probe and the contact pin, said circuit comprising means for applying voltage between the contact pin and the contact probe and means for determining whether the contact probe has made electrical connection with the electrical conductor.

2. A testing station according to claim 1 wherein there are provided a plurality of contact pins electrically connected one to another.

3. A testing station according to claim 1 wherein the angle of movement of the probe to the longitudinal axis of the end of the conductor is substantially 90°.

4. A testing station according to claim 1 wherein the pin is resiliently mounted adjacent said receptacle means for longitudinal movement 5. A testing station according to claim 4 further comprising a block of elastomeric material mounted adjacent said receptacle means, said pin being resiliently mounted to said block.

6. A testing station according to claim 1 further comprising a spike mounted adjacent to and extending beyond the pin in the same direction with respect thereto, the spike being disposed to locate and align the conductor with respect to the pin.

7. A testing station according to claim 1 wherein the contact probe is of substantially circular construction, with the circumferential edge thereof constructed to pierce the conductor insulation.

8. A testing station according to claim 1 further comprising means for moving the probe circumferentially about the longitudinal axis of the end of the conductor.

9. A testing station according to claim 8 further comprising a cam profile, a cam follower for each said at least one contact probe and resilient biasing means for urging each cam follower against the cam profile, such that the movement of the probe about the end of the conductor causes the probe to be moved by the cam profile and each cam follower against the action of the resilient biasing means to pierce the insulation material covering the conductor.

10. A testing station according to claim 9 further comprising a probe mounting means, said contact probe, said cam profile, said each cam follower and said resilient biasing means being mounted to said probe mounting means, the probe mounting means being rotatable by a belt and pulley arrangement about the longitudinal axis of the end of said conductor to enable movement of the probe thereabout.

11. A method of testing at least one electrical conductor covered in electrically insulating material comprising the steps of: providing at least one probe and at least one contact pin; moving said probe along a plane at an angle to the longitudinal axis of one of the free ends of the conductor such that the probe pierces the insulating material covering the conductor to make electrical connection therewith; moving the contact pin in a direction along the longitudinal axis of the one free end of the conductor to engage and electrically contact the end of the conductor; electrically interconnecting the probe and the pin; and applying a voltage between the pin and the probe to give an indication of whether the probe has made an electrical connection with its respective conductor.

12. A method of testing at least one elongated electrical conductor having opposed first and second free ends and being covered along its length in electrically insulating material comprising the steps of: providing at least one first contact probe and at least one second contact probe; moving the first contact probe along a plane at an angle to the longitudinal axis of the first free end of the conductor such that the first contact probe pierces the insulating material covering the conductor in the region of the first free end; testing whether the first contact probe has made an electrical connection with the conductor; moving the second contact probe along a plane at an angle to the longitudinal axis of the second free end of the conductor such that the second contact probe pierces the insulating material covering the conductor in the region of the second free end; testing whether the second contact probe has made an electrical connection with the conductor; making an electric circuit between the first contact probe and the second contact probe; and applying a voltage between the first and second contact probes to test the electrical conductor.

13. A method according to claim 12 wherein the testing whether the first contact probe has made an electrical connection with the conductor is carried out by: providing at least one contact pin; moving the contact pin in a direction along the longitudinal axis of the first free end to engage and electrically contact the conductor; making an electric circuit between the first contact probe and the contact pin; and applying a voltage between the pin and the first contact probe to give an indication of whether the first contact probe has made an electrical connection with the conductors.

14. A method according to claim 12 wherein the testing whether the second contact probe has made an electrical connection with the conductor is carried out by: providing at least one second contact pin; moving the second contact pin in a direction along the longitudinal axis of the second free end to engage and electrically contact with the conductor; making an electric circuit between the second contact probe and the second contact pin; and applying a voltage between the second contact pin and the second contact probe to give an indication of whether the second contact probe has made an electrical connection with the conductors.

* * * * *